United States Patent [19]

Bonnefoy-Claudet et al.

[11] 4,017,812
[45] Apr. 12, 1977

[54] METHOD OF PROCESSING A SIGNAL, AND CORRESPONDING DEVICES

[75] Inventors: Jean-Paul Bonnefoy-Claudet, St-Martin d'Heres; Michel Martin, Eybens; Edmond Tournier, Grenoble, all of France

[73] Assignee: Commissariat a l'Energie Atomique, Paris, France

[22] Filed: July 31, 1975

[21] Appl. No.: 600,273

[30] Foreign Application Priority Data

Aug. 2, 1974 France .......................... 74.26992

[52] U.S. Cl. .......................... 333/70 A; 307/229; 307/240; 329/50; 333/76
[51] Int. Cl.² .................... H03H 7/28; H03D 3/18; H03H 7/15; H03H 7/50
[58] Field of Search .......... 333/70 A, 70 R, 28 R, 333/19, 20; 329/50; 328/139, 165, 166, 167; 325/42, 52, 58, 63, 65, 171, 313, 419, 323, 487, 473; 307/229, 241, 269; 235/181

[56] References Cited

UNITED STATES PATENTS

| | | | |
|---|---|---|---|
| 3,403,345 | 9/1968 | Frank et al. | 329/50 X |
| 3,432,761 | 3/1969 | Morine | 328/139 X |
| 3,483,546 | 12/1969 | Ausfeld | 325/63 X |
| 3,493,876 | 2/1970 | Zimmerman | 329/50 X |
| 3,729,695 | 4/1973 | Condon | 333/70 A |
| 3,774,125 | 11/1973 | Condon et al. | 333/70 A |
| 3,793,599 | 2/1974 | Coor | 333/70 A |
| 3,867,620 | 2/1975 | Coor | 235/181 |

*Primary Examiner*—Alfred E. Smith
*Assistant Examiner*—Marvin Nussbaum
*Attorney, Agent, or Firm*—William R. Woodward

[57] ABSTRACT

In the synchronous detection signals of frequency Fo immersed in a noise, an auxiliary signal is produced having a period ½ Fo and in the form of a rectified symmetrical wave, by rectifying a symmetrical wave of period 1/Fo. The signal to be filtered is multiplied by the auxiliary signal and synchronous filtering or synchronous detection on the frequency Fo is performed on the signal obtained after the above-mentioned multiplication. Preferably the auxiliary signal is produced in the form of a rectified sinusoidal wave and a square wave reference signal from which the above-mentioned symmetrical wave is derived, having the period 1/Fo, is also used to control the synchronous detection or the synchronous filtering.

14 Claims, 6 Drawing Figures

METHOD OF PROCESSING A SIGNAL, AND CORRESPONDING DEVICES

The invention relates to a method of processing a signal, applications of the method, a device for working the method and applications of the device. The invention is applicable to electronics and more particularly to the synchronous detection of alternating electric signals immersed in noise.

In order to extract a useful signal from a noise by a method of synchronous detection, it is frequently necessary to filter the input signal first, so as to reduce the frequency band, so that considerable amplification is possible without the risk of saturation.

Some known filters which can be used for this purpose comprise a high-pass filter associated with a low-pass filter, each filter being separately adjustable and each pass-band being adjustable.

Other known synchronous filters are really synchronous pre-detection circuits comprising two capacitors in parallel associated with switches controlled by a reference signal. A filter of this kind will be described in detail hereinafter. The filter acts on a noisy sinusoidal input signal and puts out a square-wave voltage, in contrast to the synchronous detector proper, which delivers a d.c. voltage. It operates in somewhat the same manner as a synchronous detector, involving multiplication by a square-wave signal at the reference frequency, and thus has advantage (reduction in the band width and therefore in the noise) but also has disadvantages, due to the appearance of spurious signals around odd harmonics of the useful signal frequency. These signals may have considerable amplitude, for example in the case of the third harmonic. In the rest of the description, we shall use the term "isosynchronous" to denote this kind of synchronous processing.

The invention relates to a processing method compatible with isosynchronous detection and free from the aforementioned spurious signals. To this end, the signal to be processed is multiplied by an appropriate signal, after which isosynchronous detection is carried out.

More specifically, the invention relates to a method of filtering a signal around a frequency Fo, characterised in that an auxiliary signal is produced having the period ½ Fo and in the form of a rectified symmetrical wave, the period of the symmetrical wave being 1/Fo; the signal to be filtered is multiplied by the auxiliary signal; and isosynchronous filtering or isosynchronous detection at the frequency Fo is performed on the signal obtained after the aforementioned multiplication. By a symmetrical wave is meant a wave of which the time diagrams of the positive and negative half periods are each symmetrical and are mirror images of each other about the time axis.

Preferably, an auxiliary signal is produced in the form of a rectified sinusodial wave.

The rectified sinusoidal auxiliary signal should be obtained from a reference signal having a period a/Fo, which is also used to control the isosynchronous detection or the isosynchronous filtering.

In the rest of the description, we shall use the term "improved synchronous filtering (or filter)" and "improved synchronous detection (or detector)" to denote the two processes (or processing devices) based on the invention.

When the signal to be filtered comprises a sinusoidal useful signal of known frequency immersed in noise, the reference signal should have the same period as the useful signal and may advantageously be put in phase with the useful sinusoidal signal.

The invention also relates to an improvement to methods of synchronous detection, wherein the synchronous detection operation is preceded by an improved synchronous filtering operation according to the aforementioned method, the same reference signals being used for the improved synchronous filtering operation and the synchronous detection operation.

The invention also relates to an application of the aforementioned method, i.e. a method of Fourier spot analysis characterised in that a signal to be analysed is subjected to two parallel improved synchronous detection operations, the two operations being performed at the Fourier analysis frequency, one being in phase quadrature with respect to the other.

The invention also relates to a device for working the aforementioned method, characterised in that it comprises: means for producing an auxiliary electrical signal having the period ½ Fo and in the form of a rectified symmetrical wave, the period of the symmetrical wave being 1/Fo; a two-input multiplier, one input receiving the signal to be filtered and the other receiving the auxiliary signal; and an isosynchronous detector or filter at the frequency Fo connected to the multiplier.

Preferably, the means for producing the auxiliary electric signal comprise a circuit for producing a signal in the form of a rectified sinusoidal wave, and having the period ½ Fo.

Preferably also, the filter device comprises a means for generating a reference signal in the form of square waves having a period 1/Fo connected to the isosynchronous detector and to the circuit for producing the signal in the form of a rectified sinusoidal wave.

In one advantageous embodiment, the isosynchronous filter is a filter having two capacitors in parallel associated with two switches actuated by the square-wave reference signal.

The invention also relates to an improvement to synchronous detectors, wherein a synchronous detector is preceded by an improved synchronous filtering device as described hereinbefore, the same reference signals being used for the filtering device and for actuating the synchronous detector.

The invention also relates, by way of application of the aforementioned processing, to a spot Fourier analyser, characterised in that it comprises two channels in parallel each receiving the signal to be analysed and each comprising an improved synchronous detector of the previously-defined kind and means for producing a reference signal at the Fourier analysis frequency, the reference signal being applied to one channel directly and to the other channel via a 90° phase shifter.

The invention will now be described by way of example with reference to the accompanying drawings, in which.

Figure 3:
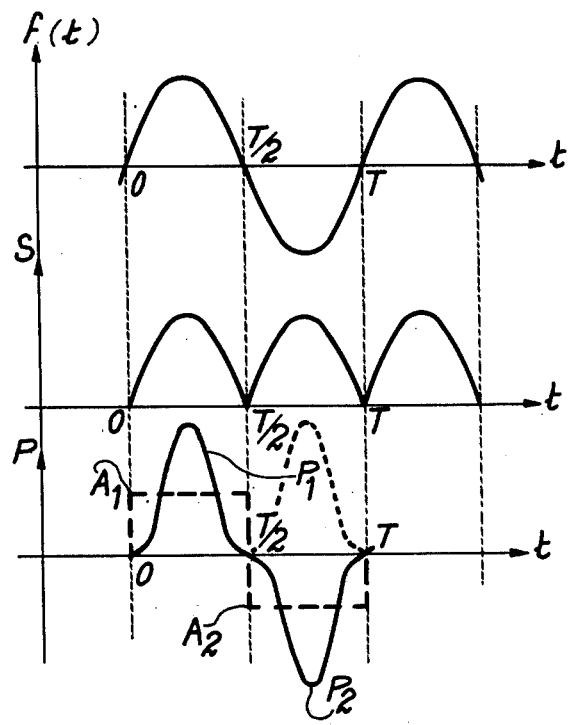
Figure 4:
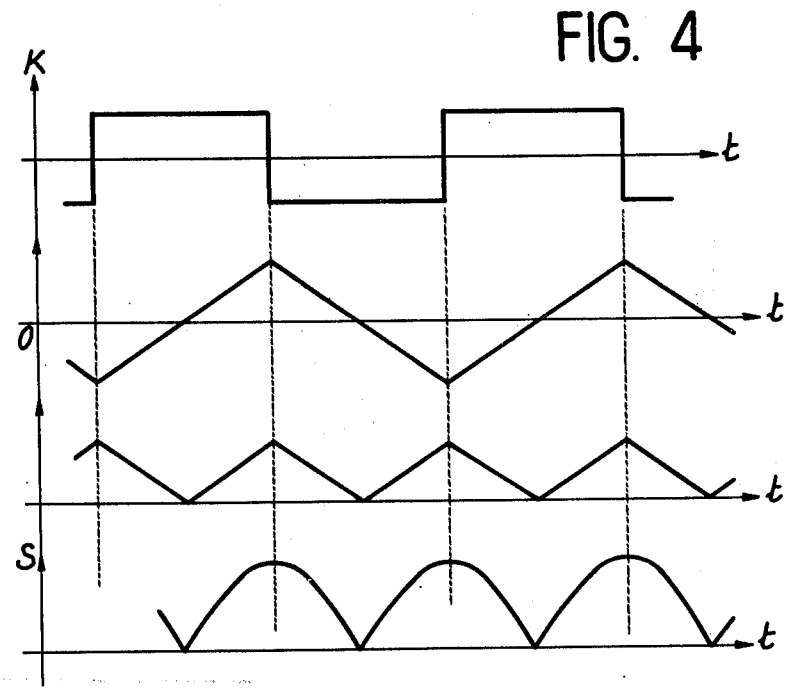
Figure 5:
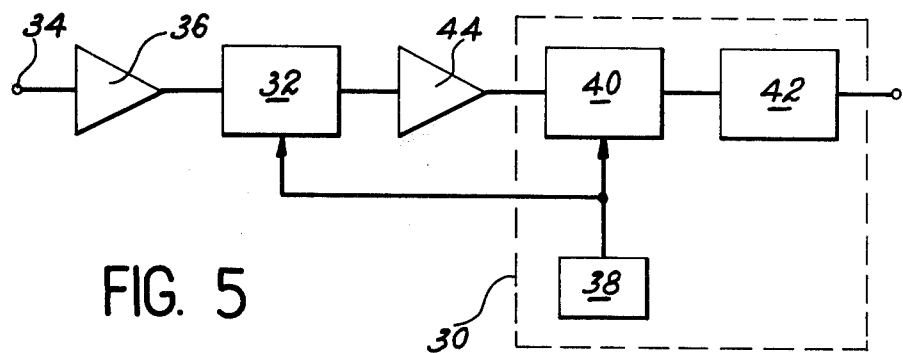
Figure 6:
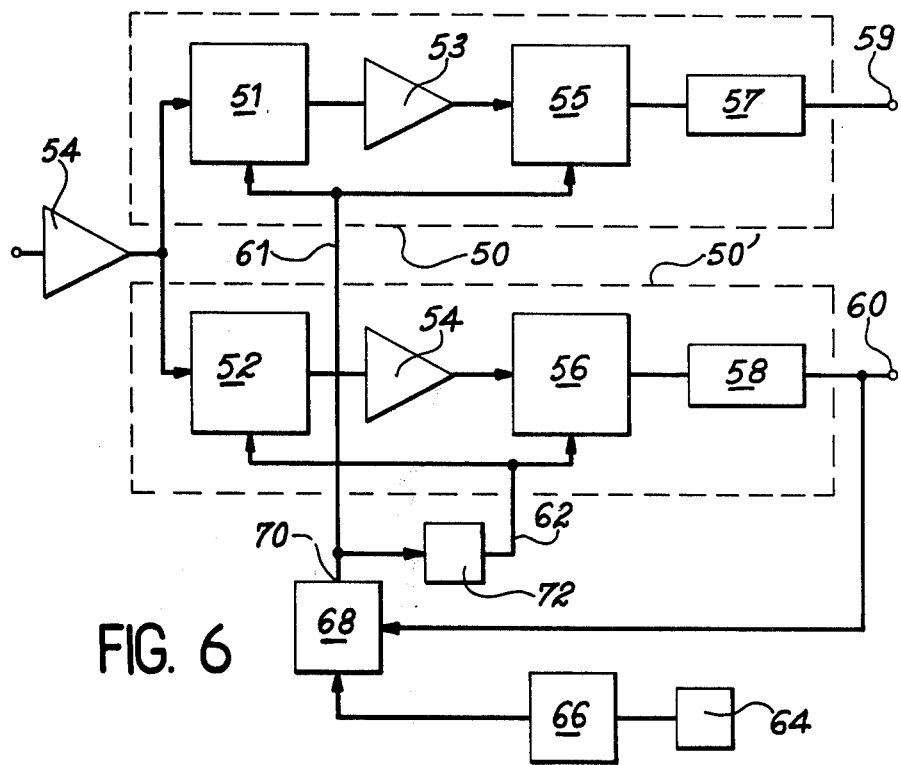

FIG. 3 diagrammatically illustrates the operation of the improved synchronous filter according to the invention;

FIG. 4 is another diagram illustrating the production of a signal in the form of a rectified sinusoidal wave from a square-wave reference signal;

FIG. 5 is a general diagram of a synchronous detection circuit improved by using an improved synchronous filter according to the invention; and FIG. 6 is a general diagram of a spot Fourier analyser using two parallel synchronous detection systems improved according to the invention.

By way of illustration only, it will be assumed in the following description that the auxiliary signal, which has a period ½ Fo, is in the form of a rectified sinusoidal curve. Thus, the processing is adapted to extracting a sinusoidal useful signal from a complex input signal which can be broken up into a Fourier series. However, as will be more clearly shown hereinafter, any other signal may be used provided it is obtained by rectifying a periodic signal having a period 1/Fo and a zero average value, in which case the process will be adapted to extracting a useful signal having the same shape as the periodic signal.

Figure 1:
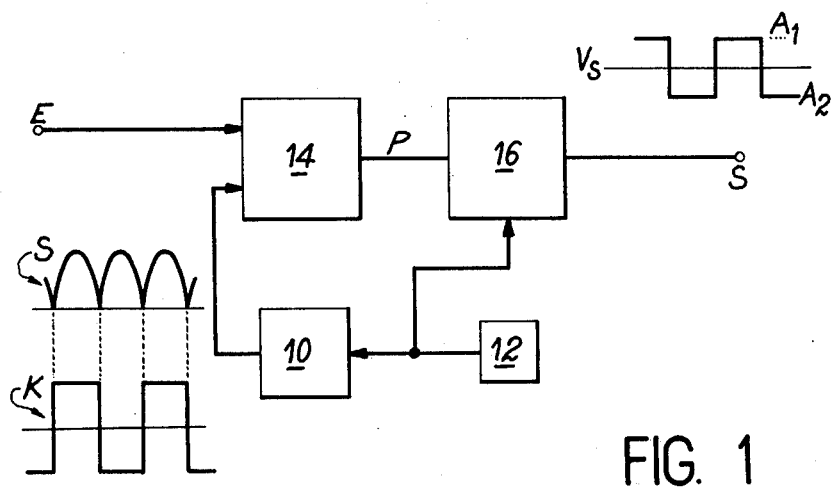
FIG. 1 is a general diagram of the filter according to the invention.

FIG. 1 is a general diagram of an improved synchronous filter according to the invention. The filter comprises an input E receiving the signal to be filtered; means 10 acting on a reference signal K delivered by circuit 12 and producing a signal S in the form of a rectified sinusoidal wave; a multiplier 14 having two inputs, one receiving the signal to be filtered and applied to input E and the other receiving the rectified sinusoidal signal S, the multiplier delivering a signal P; and an isosynchronous filter 16 connected to multiplier 14 and actuated by the reference signal K delivered by circuit 12. Output S delivers a signal $V_S$ in the form of square waves having amplitudes $A_1$ and $A_2$ respectively.

The isosynchronous filter or detector 16 can be of any known kind, the shape of the signal $V_S$ varying in consequence. In one embodiment, the filter or detector comprises a circuit as shown in FIG. 2, comprising a resistor 20 receiving signal P, two capacitors $C_1$, $C_2$ and two switches $I_1$, $I_2$ actuated by the reference signal K.

Switches $I_1$ and $I_2$ connect capacitors $C_1$, $C_2$ alternately to earth, thus closing the load circuit.

The circuit in FIG. 2 operates as follows. When the control signal K is in phase with the signal P applied to the circuit input, capacitors $C_1$, $C_2$ respectively transmit the positive and negative halfwaves of the applied signal P with a time constant RC, R being the value of resistor 20 and C being the common value of capacitors $C_1$ and $C_2$. Thus, the output signal $V_S$ is a square-wave voltage having amplitudes $A_1$, $A_2$ which depend on the average values of each portion of signal P, the two portions being determined by the two levels of the reference signal K.

Figure 2:
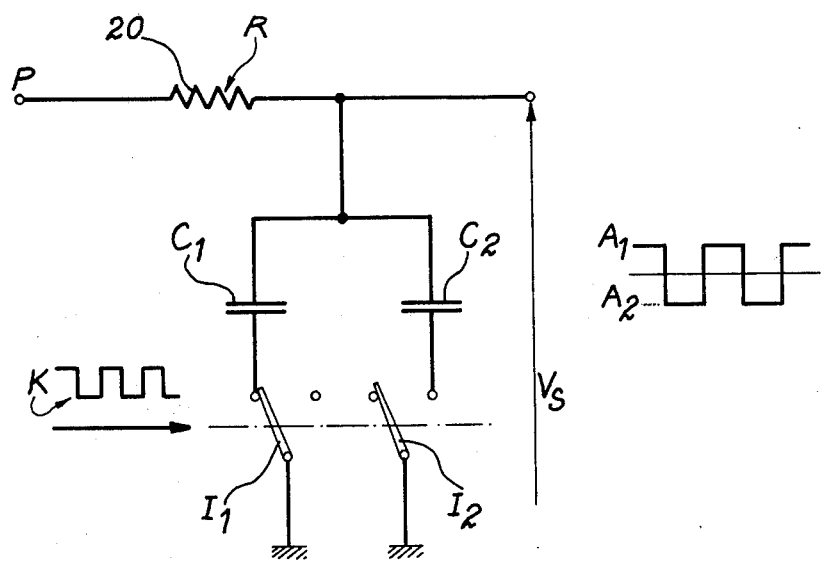
FIG. 2 shows an embodiment of an isosynchronous filter for use according to the invention.

In order to describe the basic operation of the invention we shall assume, non-limitatively and by way of illustration, that we have an isosynchronous filter as in FIG. 2. We shall also assume, to simplify the description, that the input signal applied to filter input E is a sinusoidal signal $f(t)$ having a period T. In practice, the signal can have any shape. It may, for example, comprise a useful signal which is effectively sinusoidal but is immersed in noise. The auxiliary signal S corresponds to a rectified sinusoidal wave having the same period as the reference signal. The reference signal is obtained by conventional methods of synchronous detection for producing a rectangular reference signal having the same period as the useful sinusoidal signal and having a given phase relationship. According to the main feature of the filter according to the invention, the input signal $f(t)$ is multiplied by the signal S to give a product P. The shapes of the signals $f(t)$, S and P are illustrated in FIG. 3. Signal P comprises a positive half-wave $P_1$ between the instants P/2 and T. As explained, the isosynchronous filtering circuit for the signal P delivers a square-wave signal having the following amplitudes respectively:

$$A_1 = \frac{2}{T} \int_O^{T/2} f(t) \cdot \sin 2\pi Fo\, t\, dt$$

$$A_2 = \frac{2}{T} \int_{T/2}^{T} f(t) \cdot \sin (2\pi Fo\, t + \pi)\, dt$$

$A_1$ and $A_2$ representing the average values of the signals $P_1$ and $P_2$ produced during each half-period. The peak-to-peak amplitude of the square-wave signal depends only on the amplitude of the input signal at the frequency Fo = 1/T and on the phase of the aforementioned signal with respect to the reference signal. The filter, therefore, has a single line at the frequency Fo and a bandwidth equal to that of the isosynchronous detection circuit, i.e. $\pi$ RC at 3 db.

FIG. 4 diagrammatically illustrates the formation of a signal S in the form of a rectified sinusoidal wave, starting from a square-wave reference signal K. The circuits for making this transformation are conventional and will not be described here. In FIG. 1 they are diagrammatically represented by a unit 10 which receives signal K in the form of square waves having the period 1/Fo. Signal K triggers a saw-tooth (second line in FIG. 4) centered on the value zero. The saw-tooth is subsequently rectified (line 3) and actuates a shaping circuit for generating sine waves. The generator delivers the signal S in the form of a rectified sinusoidal wave.

As FIG. 4 shows, the rectified saw-tooth signal may if required be used to provide an auxiliary signal S, since it satisfies the required conditions.

After this basic description of the method of filtering according to the invention and of the corresponding filter, we shall set out the advantages thereof by a comparison with the conventional method and circuit, for example those based on a Fourier transform.

As is known, in the case of the Fourier transform of a signal $f(t)$, we consider the terms An, the value of which is calculated by the conventional formula:

$$An = \frac{1}{T} \int_O^T f(t) \sin \frac{2\pi n}{T} t\, dt$$

For simplicity, we shall consider only the fundamental term obtained for $n = 1$. In both the conventional Fourier transform process and in the process according to the invention, the value of the function $f(t)$ to be analysed is called $y$ and the function by which $y$ is multiplied is called $x$.

Using these conventions, the integral defining the first harmonic $A_1$ is written as follows:

$$A_1 = \frac{1}{T} \int_O^T x\, y\, dt$$

Thus, in the conventional Fourier transform method, we calculate the product P of $y$ by a sinusoidal function $x$ and then calculate the average value of P, thus obtaining a continuous value.

In the method according to the invention, we also calculate the produce P of $y$ by a function $x$, but $x$ is a function which always has the same sign, so that the product P has a non-zero average value over the interval T. We then separately calculate the amplitudes $A_1$ of the positive arch and $A_2$ of the negative arch, defined by:

$$A_1 = \frac{2}{T} \int_0^{T/2} x\, y\, dt$$

and $$A_2 = \frac{2}{T} \int_{T/2}^{T} x\, y\, dt$$

In both methods, the product P is obtained by a multiplier (i.e. multiplier 14 in FIG. 1 in the case of the invention). This device may be subject to certain errors, due either to an incorrect zero at the inputs or to non-linearity. A multiplier of this kind, therefore, does not give the exact product $P = xy$ but a product $P'$ containing spurious terms, which may be evaluated as follows:

The product P has the following form:

$$P' = (c + x + ax^2 + a'x^3 + \ldots)(d + y + by^2 + b'y^3 + \ldots)$$

For simplicity, we shall consider only the first terms of this expansion and assume that the product $P'$ is equal to:

$$P' = (c + x + ax^2)(d + y + by^2)$$

where $c$ and $d$ represent incorrect zeros at the respective inputs of the auxiliary signal S and of the input signal to be filtered, and where $a$ and $b$ represent the respective non-linearity at the aforementioned inputs.

To compare the two methods we can then evaluate two sorts of errors, i.e. those made in the product xy in the case where the signals $x$ and $y$ are known, and those resulting from the presence of noise affecting the input signal. To evaluate the second sort of errors, we can consider the special case where the signal $y$ is a white noise. This latter evaluation is important since, in practice, the input signal may comprise a low-amplitude useful signal immersed in noise.

First, therefore, we shall consider the case of the conventional Fourier transform method and evaluate the error with regard to the product P in the case of a sinusoidal input signal $y$ having the same frequency as the sinusoidal wave $x$, which is assumed to be not rectified.

If we expand the previously-defined product $P'$, we obtain terms having the following forms respectively:

| | |
|---|---|
| $ax^2y$ | a signal having zero average value |
| $bxy^2$ | a signal having zero average value |
| $xy$ | the desired product |
| $ab(xy)^2$ | a signal having a non-zero average value |
| $adx^2$ | a signal having a non-zero average value |
| $cby^2$ | a signal having a non-zero average value |
| $dx$ | a term having zero average value |
| $cy$ | a term having zero average value; and |
| $cd$ | a continuous term. |

The method is such that only terms of $P'$ which have any final importance are those having a non-zero average value:

$$P' = P + (xy)^2 ab + adx^2 + cby^2 + cd.$$

This can also be written $P' = P + \Delta P_1$, $\Delta P_1$ being the error.

If now we assume that the input signal $y$ is a white noise, we can make the same calculation, and will find that $P'$ comprises random signals having a zero average value (e.g. in the form $ax^2y$), signals having a non-zero average value (e.g. the terms $ab(xy)^2$), signals having a zero average value (e.g. dx) and a continuous signal (the term cd). If we retain only the terms having a non-zero average value, the product $P'$ takes the form:

$$P' = (xy)^2 ab + adx^2 + cby^2 + cd$$

i.e. $P' = \Delta P_1$

If we bear in mind that the integral from 0 to T/2 or from T/2 to T of a signal at the frequency 2Fo is zero and that continuous signals give two equal integrals having the same sign, and if we retain only those terms having a fundamental at the frequency Fo, we finally obtain the following, in the method according to the invention:

$$P' = P + ax^2y + cy$$

i.e. $P' = P + \Delta P_2$, where $\Delta P_2$ is the error.

In the case where the input signal $y$ is a white noise, we obtain terms which correspond to random signals having a zero average value, such as the product xy of the signals at the frequency 2Fo and the continuous signals; in such cases the expression for $P'$ shows that there is not component at the frequency Fo.

The first conclusion, therefore, is that the method according to the invention does not introduce any spurious signal at the frequency Fo coming from the noise, which is a very important advantage over the method based on the Fourier transform. The second conclusion relates to a comparison between $\Delta P_1$ and $\Delta P_2$, the errors made in evaluating the product.

In this case it is interesting to find cases where the errors are equal, so as to define the conditions in which the two methods are equivalent. The errors $\Delta P_1$ and $\Delta P_2$ have the following values:

$$\Delta P_1 = (xy)^2 ab + adx^2 + cby^2 + cd$$

and $$\Delta P_2 = ax^2y \text{ and } cy$$

The coefficients $a$, $b$, $c$ and $d$ can be considered as having the same order of magnitude and as being small. We shall take the difficult case where the product $xy$ and the signal $y$ are very much smaller than $x$. On the other hand, in the first method the product $cd$ can be compensated so that the relative error in the first method is substantially of the order of $\Delta P_1/P = adx/y$.

In the method according to the invention, the term $ax$ is much less than the term $c/x$ and we can consider that $\Delta P_2/P = ax$ is approximately true.

The two methods, therefore, are equivalent when $ax$ is equal to $adx/y$, i.e. when the input signal $y$ is not much different from the coefficient $d$.

However, as soon as the signal to be filtered is less than the false zero of the multiplier at the input of the signal to be filtered, the method according to the invention becomes more useful than the conventional method. Consequently, the filtering method and the filter according to the invention are much more adapted to processing weak signals immersed in noise than the method and circuits based on the Fourier transform.

In addition, the filter according to the invention has the advantage of being particularly well suited to isosynchronous detection circuits, which it can improve. In this application, it is incorporated in a conventional synchronous detection circuit as shown in FIG. 5. The total synchronous detection circuit 30 is of a known kind. It comprises a circuit 38 delivering a reference signal applied to a detector 40 and an averaging circuit 42. Circuit 30 is preceded by a filter 32 according to the invention, which receives the input signal applied to the input terminal 34 by a first alternating current amplifier 36. Filter 32 can be actuated by a circuit 38 delivering the reference signal required for isosynchronous detection.

As explained, the filter 32 according to the invention has a line at the frequency Fo, which is that of the reference signal from the circuit 38. In certain cases, as is known, the frequency may be that of the signal applied to input 34, in which case filter 32 behaves like a coupled filter. Since the filter 32 according to the invention puts out an alternating signal, an additional alternating current amplifier 44 can be disposed between filter 32 and the synchronous detection circuit 30. If, in the circuit in FIG. 5, the filter 32 according to the invention were replaced by the known filter shown in FIG. 2, contributions from the spurious signals would be found in interfering lines centered on odd harmonics, i.e. filtering would be imperfect.

In another application of the filter according to the invention, illustrated in FIG. 6, the filter is used to construct a spot Fourier analyser. An analyser of this kind comprises two channels in parallel 50 and 50' respectively, each receiving the input signal via an amplifier 54, which has an input terminal to which the signal for analysis is applied. The two channels each comprise a synchronous detector improved in accordance with the application illustrated in FIG. 5, i.e. channel 50 comprises a filter 51 according to the invention followed by an alternating current amplifier 53 connected to a synchronous detector 55 and an averaging circuit 57; the output terminal bears the reference 59. Similarly, channel 50' comprises a filter 52 according to the invention followed by an amplifier 54, a synchronous detector 56 and an integrator 58; the output terminal bears the reference 60.

Each channel is actuated by reference signals conveyed by connection 51 for channel 50 and connection 62 for channel 50'. The reference signals are obtained from a clock 64 actuating e.g. a harmonics generator 66 delivering a reference signal applied to a phase-shifter 68, whose output 70 delivers a reference signal which is applied directly via connection 61 to the first reference channel 50 and via a $\pi/2$ phase-shifter 72 and a connection 62 to channel 50'. Clock 64 is controlled by a signal obtained by conventional means (not shown). The two synchronous detection circuits, which are actuated by reference signals in phase quadrature, deliver standard and phase information respectively with regard to the rank of the harmonic coming from generator 66.

In the case where the frequency of the useful part of the input signal is known, the analyser is provided with means for coupling the reference signal phase to the phase of the useful part of the input signal. These means are represented by the phase-shifting circuit 68. The signal from integrator 58 is applied to phase-shifter 68, which may advantageously have a linear response in phase. Consequently, the phase shift of the reference signal conveyed via output 70 has a value such that the signal at the input of integrator 58 is zero and the output signal from integrator 58 is constant. This means that the reference signal applied to channel 50' is in phase quadrature with the input signal and that therefore the reference signal applied via connection 61 to circuit 50 is in phase with the input signal.

The rank of the harmonic can be varied by acting on the frequency of clock 64, so as to obtain the amplitude at 59 and the phase at 60 of the input signal component at the same harmonic frequency, thus provising a Fourier spot analysis. Preferably, the corresponding analyser is used for signals having a phase which fluctuates slowly.

We claim:

1. A method of processing an alternating electric signal of an assigned frequency Fo, comprising the steps of:
   producing first and second symmetrical reference electrical waves having the frequency Fo and the period 1/Fo and mutually coherent in phase, said first reference wave being a non-rectangular wave and said second reference wave being a rectangular wave;
   producing an auxiliary signal having the period ½ Fo by rectifying said first reference wave;
   multiplying the signal to be processed by said auxiliary signal in an electronic multiplier; and
   isosynchronously processing the output of said multiplier at the frequency Fo in a synchronous chopper-integrator circuit switched by said second reference wave and arranged for separately and successively integrating alternate sequences of ½ Fo periods of said multiplier output.

2. A method according to claim 1, in which said first reference wave is derived electronically from said second reference wave.

3. A method according to claim 1, in which said first reference wave is a wave having a maximum slope that does not substantially exceed that of a sinusoidal wave.

4. A method according to claim 3, in which said first reference wave is a sinusoidal wave and in which said auxiliary signal is a rectified sinusoidal wave.

5. A method according to claim 1, in which there is also performed the step of subjecting the output of said chopper-integrator to synchronous detection in a balanced detector, using said second reference wave for controlling the switching of said balanced detector.

6. A method of processing an alternating electric signal of a nominal frequency Fo, comprising the steps of:
   producing first and second symmetrical reference waves having the frequency Fo and the period 1/Fo, said first reference wave being a wave having a maximum slope not substantially exceeding that of a sinusoidal wave and said second reference wave being a rectangular wave;

producing third and fourth symmetrical reference waves of the same frequency, period and form as said first and second reference waves, and of phases respectively in quadrature with said first and second reference waves;

producing first and second auxiliary signals by respectively rectifying said first and third reference waves;

multiplying the signal to be processed by said first auxiliary signal in a first electronic multiplier;

multiplying the signal to be processed by said second auxiliary signal in a second electronic multiplier;

isosynchronously filtering the output of said first multiplier in a synchronous chopper-integrator circuit switched by said second reference wave and arranged for separately and successively integrating alternate sequences of ½ Fo periods of the output of said first multiplier;

isosynchronously filtering the output of said second multiplier in a second synchronous chopper-integrator circuit switched by said fourth reference wave and arranged for separately and successively integrating alternate sequences of ½ Fo periods of the output of said second multiplier, and controlling simultaneously the phase of all said reference waves so that said first chopper-integrator circuit operates coherently with respect to the signal to be processed and said second chopper-integrator operates in quadrature with reference to said signal.

7. A signal processing circuit for an alternating electrical signal of an assigned frequency Fo comprising, in combination:

means for producing first and second symmetrical electrical reference waves of the frequency Fo and of the period ½ Fo and mutually coherent in phase, said first reference wave being a non-rectangular wave and said second reference wave being a rectangular wave;

means for rectifying said first reference wave and thereby producing an auxiliary electrical signal having the period ½ Fo;

a two-input electronic multiplier circuit having one input connected to a source of the signal to be processed and the other input connected to the output of said rectifying means;

and synchronous chopper-integrator circuit means for separately and successively integrating alternate sequences of ½ Fo periods of said multiplier circuit output, said chopper-integrator having a signal input connected to the output of said multiplier circuit and a switching input connected to an output of said means for producing reference waves supplying said second reference wave as an output.

8. A signal processing circuit according to claim 7, in which said reference wave producing means includes means for producing said first reference wave as a wave having a maximum slope not substantially exceeding that of a sinusoidal wave.

9. A signal processing circuit according to claim 7, in which said means for producing reference waves includes means for providing said first reference wave as a sinusoidal wave and in which the output of said rectifier accordingly supplies said auxiliary electric signal in the form of a rectified sinusoidal wave.

10. A signal processing circuit according to claim 8, in which said means for producing reference waves includes means for deriving said first reference wave from said second reference wave.

11. A signal processing circuit according to claim 7, in which said chopper-integrator circuit means comprises a resistor and two capacitors both having one terminal connected to the same terminal of said resistor, said capacitors having their respective other terminals connected to oppositely switched paths to ground controlled by switching means responsive to said second reference wave and connected to said output supplying said second reference wave, said resistor having its other terminal connected to the output of said multiplier circuit.

12. A signal processing circuit according to claim 7, having also balanced synchronous detector means of which a signal input is connected to the output of said chopper-integrator circuit means and of which the switching input is connected to said output of said reference wave producing means which supplies said second reference wave, for switching said balanced synchronous detector means.

13. A signal processing circuit according to claim 7, comprising also:

means for deriving, from at least one of said reference waves, third and fourth reference waves of the same shape and frequency as said first and second reference waves respectively, but displaced 90° in phase therefrom;

means for rectifying said third reference wave and thereby producing a second auxiliary signal having the period ½ Fo;

a second two-input electronic multiplier circuit having one input connected to said source of a signal to be processed and the other input connected to the output of said second rectifier means for receiving therefrom said second auxiliary signal;

and second chopper-integrator circuit means having a signal input connected to the output of said second multiplying circuit and having a switching input connected to an output of said deriving means supplying said fourth reference wave.

14. A signal processing circuit according to claim 13, in which there are also provided means for automatically controlling the phases of said reference waves simultaneously so as to make substantially constant the output of said second chopper-integrator circuit means, thereby establishing coherency with said signal in the operation of said first chopper-integrator circuit means.

* * * * *